US010326091B2

(12) United States Patent
Kang (10) Patent No.: US 10,326,091 B2
(45) Date of Patent: Jun. 18, 2019

(54) ORGANIC ELECTROCHEMICAL DEVICE, AND METHOD FOR MANUFACTURING SAME (71) Applicant: LG CHEM, LTD., Seoul (KR)

(72) Inventor: Tae-Sik Kang, Beavercreek, OH (US)

(73) Assignee: LG Chem, Ltd. (KR)

( * ) Notice: Subject to any disclaimer, the term of this patent is extended or adjusted under 35 U.S.C. 154(b) by 438 days.

(21) Appl. No.: 14/398,651

(22) PCT Filed: May 9, 2013

(86) PCT No.: PCT/KR2013/004111
§ 371 (c)(1),
(2) Date: Nov. 3, 2014

(87) PCT Pub. No.: WO2013/169047
PCT Pub. Date: Nov. 14, 2013

(65) Prior Publication Data
US 2015/0123094 A1 May 7, 2015

Related U.S. Application Data (60) Provisional application No. 61/644,536, filed on May 9, 2012.

(51) Int. Cl.
H01L 51/44 (2006.01)
H01L 51/50 (2006.01)
(Continued)

(52) U.S. Cl.
CPC ............ *H01L 51/441* (2013.01); *G02F 1/155* (2013.01); *H01L 51/4246* (2013.01);
(Continued)

(58) Field of Classification Search
CPC ..... H01L 51/4206; H01L 51/44; H01L 51/50; H01L 51/5012; H01L 51/5032;
(Continued)

(56) References Cited

U.S. PATENT DOCUMENTS 6,069,313 A 5/2000 Kay
2004/0031965 A1* 2/2004 Forrest ............... H01L 27/288
257/79

(Continued)

FOREIGN PATENT DOCUMENTS

JP 2004152786 A 5/2004
JP 200660104 A 3/2006
(Continued)

OTHER PUBLICATIONS

Furst et al. WO 2009043684A1, machine translation—English (Year: 2009).*

*Primary Examiner* — Susan D Leong
(74) *Attorney, Agent, or Firm* — Myers Bigel, P.A.

(57) ABSTRACT

The present invention relates to an organic electrochemical device and a fabrication method thereof. The organic electrochemical device according to the present invention comprises: a substrate; a first electrode provided on the substrate; an intermediate layer provided on the first electrode; a second electrode provided on the intermediate layer; and a first organic material layer, in which at least a part of the first organic material layer is in contact with the second electrode and the intermediate layer.

14 Claims, 9 Drawing Sheets (51) Int. Cl.
*H01L 51/52* (2006.01)
*H01L 51/42* (2006.01)
*G02F 1/155* (2006.01)
*H01L 51/56* (2006.01)

(52) U.S. Cl.
CPC .......... *H01L 51/44* (2013.01); *H01L 51/5012* (2013.01); *H01L 51/5056* (2013.01); *H01L 51/5072* (2013.01); *H01L 51/5203* (2013.01); *H01L 51/56* (2013.01); *Y02E 10/549* (2013.01); *Y02P 70/521* (2015.11)

(58) Field of Classification Search
CPC ............... H01L 51/504; H01L 51/5056; H01L 51/5048; H01L 51/5068; H01L 51/5072; H01L 51/508; H01L 51/5084; H01L 51/5088; H01L 51/52
See application file for complete search history.

(56) References Cited

U.S. PATENT DOCUMENTS

| | | | |
|---|---|---|---|
| 2004/0061438 A1* | 4/2004 | Yamazaki | H01L 27/1214 313/506 |
| 2005/0255334 A1* | 11/2005 | Kang | B82Y 10/00 428/690 |
| 2006/0027801 A1 | 2/2006 | Forrest et al. | |
| 2008/0110494 A1* | 5/2008 | Reddy | H01L 31/035272 136/255 |
| 2009/0032107 A1 | 2/2009 | Kim et al. | |
| 2009/0038683 A1 | 2/2009 | Walter et al. | |
| 2009/0056801 A1 | 3/2009 | Chun-Hsiung et al. | |
| 2009/0056810 A1* | 3/2009 | Marks | B82Y 10/00 136/263 |
| 2009/0084442 A1 | 4/2009 | Naito et al. | |
| 2009/0165849 A1 | 7/2009 | Chan et al. | |
| 2009/0211640 A1* | 8/2009 | Lee | B82Y 10/00 136/263 |
| 2009/0314350 A1 | 12/2009 | Jung et al. | |
| 2010/0051092 A1 | 3/2010 | Dumitru et al. | |
| 2010/0263727 A1 | 10/2010 | Oyamada | |
| 2010/0319765 A1 | 12/2010 | Choi | |
| 2011/0266588 A1 | 11/2011 | Gaerditz et al. | |
| 2012/0032221 A1 | 2/2012 | Klein et al. | |
| 2012/0038066 A1* | 2/2012 | Blum | H01L 51/107 257/791 |
| 2012/0204961 A1* | 8/2012 | Kato | H01L 51/448 136/263 |
| 2013/0037109 A1* | 2/2013 | Park | H01L 51/0012 136/263 |
| 2013/0069050 A1 | 3/2013 | Laurent et al. | |

FOREIGN PATENT DOCUMENTS

| | | | |
|---|---|---|---|
| JP | 2008-071937 | | 3/2008 |
| JP | 2008-071937 A | | 3/2008 |
| JP | 4087445 | | 5/2008 |
| JP | 2011192761 A | | 9/2011 |
| KR | 10-2007-0053240 | | 5/2004 |
| KR | 2007-0053240 A | | 5/2007 |
| KR | 10-2011-0074518 | | 6/2011 |
| KR | 2011-0074518 A | | 6/2011 |
| TW | 200910619 A | | 3/2009 |
| TW | 200929577 A | | 7/2009 |
| TW | 201117160 A1 | | 5/2011 |
| WO | WO-2009043684 A1 * | 4/2009 | ......... H01L 51/4246 |
| WO | 2011148064 A1 | | 12/2011 |

* cited by examiner

ORGANIC ELECTROCHEMICAL DEVICE, AND METHOD FOR MANUFACTURING SAME

TECHNICAL FIELD

The present specification relates to an organic electrochemical device and a fabrication method thereof.

BACKGROUND ART

Crystalline silicon solar cells have been widely known as a device for directly converting light energy into electric energy. The crystalline silicon solar cells are used as an independent power source, and a power source for use in a vehicle. The crystalline silicon solar cells are usually made of silicon single crystals or amorphous silicon. However, enormous amounts of energy is required to produce silicon single crystals or amorphous silicon, and in order to recover energy consumed for fabricating the solar cells, the solar cells needs to generate electric power continuously for almost as long as a ten-year period.

Meanwhile, in recent a few years, various forms of solar cells using organic molecules have been developed as a new form of a solar cell in which the technical possibility thereof has been rapidly improved. Existing organic solar cells developed until now are still at the beginning stages in energy conversion efficiency, service life, and the like. Presently, since the optical and electric stability of the organic molecules are not at a satisfactory level, the organic solar cell is one of the development fields of solar cells which have been widely studied even until now in order to improve the performances thereof.

Existing organic solar cells developed until now are very vulnerable to temperature, solar light, a high wavelength system, and the like and have many problems in energy conversion efficiency. Thus, those problems are obstacle factors to the development of solar cells using organic molecules, and particularly, because energy conversion efficiency of solar cells using organic materials is lower than that of the existing silicon solar cells, and the like and the solar cells have many limitations in use thereof, it is difficult to expand the use fields thereof.

Figure 15:
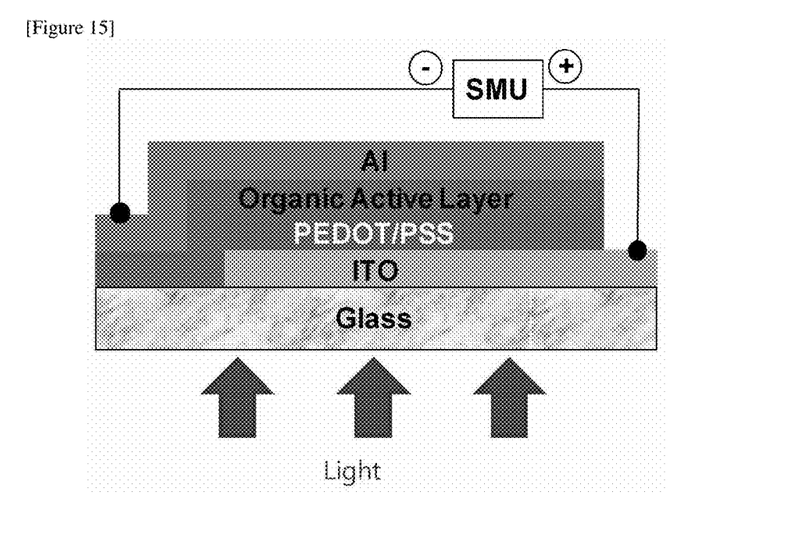
FIG. 15 is a view schematically illustrating an organic solar cell in the related art.

As illustrated in the following FIG. 15, an organic solar cell in the related art comprises an indium tin oxide (ITO) electrode provided on a glass substrate, a poly(3,4-ethylenedioxythiophene):poly(styrene sulfonate) (PEDOT/PSS) layer provided on the ITO electrode, an organic active layer provided on the PEDOT/PSS layer and the glass substrate, and an aluminum electrode provided on the organic active layer.

DETAILED DESCRIPTION OF THE INVENTION

Technical Problem

The present invention has been made in an effort to provide an organic electrochemical device having excellent power conversion efficiency, and a fabrication method thereof.

Technical Solution

The present invention provides an organic electrochemical device comprising:
a substrate;
a first electrode provided on the substrate;
an intermediate layer provided on the first electrode;
a second electrode provided on the intermediate layer; and
a first organic material layer,
in which at least a part of the first organic material layer is in contact with the second electrode and the intermediate layer.

Further, the present invention provides an organic electrochemical device comprising:
a transparent substrate;
a first organic material layer provided on the transparent substrate;
a first electrode provided on the first organic material layer;
a second electrode; and
an intermediate layer provided between the first organic material layer and the second electrode,
in which at least a part of the intermediate layer is in contact with the first electrode and the first organic material layer.

In addition, the present invention provides a method for fabricating an organic electrochemical device, the method comprising:
forming a first electrode on a substrate;
forming an intermediate layer on the first electrode;
forming a second electrode on the intermediate layer such that at least a part of the second electrode is in contact with the intermediate layer; and
forming a first organic material layer on the intermediate layer.

Furthermore, the present invention provides a method for fabricating an organic electrochemical device, the method comprising:
forming a first organic material layer on a transparent substrate;
forming a first electrode on the first organic material layer such that at least a part of the first electrode is in contact with the first organic material layer;
forming an intermediate layer on the first organic material layer and the first electrode; and
forming a second electrode on the intermediate layer.

Advantageous Effects

The organic electrochemical device according to an exemplary embodiment of the present invention may improve power conversion efficiency because an organic active layer may be formed on a second electrode and an intermediate layer. Further, the organic electrochemical device according to another exemplary embodiment of the present invention may use metal electrodes as a first electrode and a second electrode, thereby improving conductivity and being implemented at low costs.

In addition, the organic electrochemical device according to yet another exemplary embodiment of the present invention may improve flexibility of the organic electrochemical device by comprising an organic material layer on a second electrode, may reduce loss of light according to the light absorption of an electrode, a hole transporting layer, and the like by directly irradiating light on the organic material layer provided at an upper portion of the second electrode without passing light through a transparent electrode, and may increase a re-absorption rate of light due to reflection of light from a metal electrode. The organic electrochemical device according to the present invention may be applied to various organic electrochemical devices such as organic solar cells, organic photodetection elements, organic light emitting elements, and organic electrochromic elements.

EXPLANATION OF SYMBOLS FOR THE MAJOR PARTS OF THE DRAWINGS

10: Substrate
20: First electrode
30: Intermediate layer
40: Insulating layer
50: Second electrode
60: First organic material layer
70: Hole transporting layer
80: Second organic material layer
90: Electron transporting layer
100: Ion storing layer
110: Ion conductor/Electrolyte
120: Electrochromic layer

BEST MODE

Hereinafter, preferred exemplary embodiments of the present invention will be described in detail with reference to the accompanying drawings.

Figure 1:
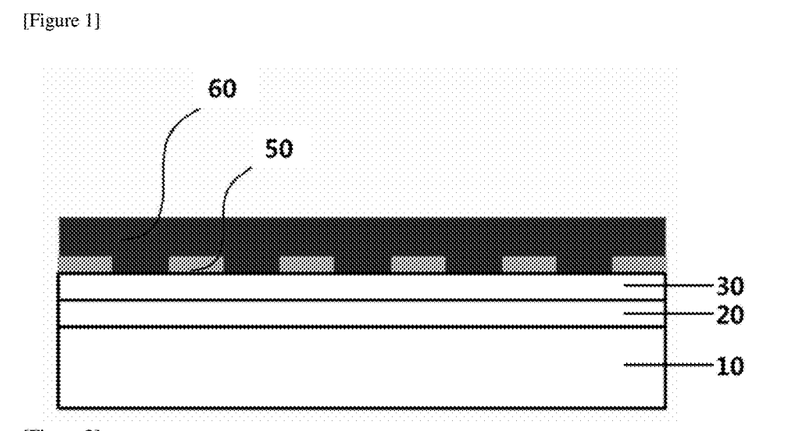
FIG. 1 is a view schematically illustrating an organic electrochemical device according to a first exemplary embodiment of the present invention.

FIG. 1 is a view schematically illustrating an organic electrochemical device according to a first exemplary embodiment of the present invention. The organic electrochemical device according to the first exemplary embodiment comprises a substrate 10, a first electrode 20 provided on the substrate, an intermediate layer 30 provided on the first electrode 20, a second electrode 50 provided on the intermediate layer 30, and a first organic material layer 60, in which at least a part of the first organic material layer 60 is in contact with the second electrode 50 and the intermediate layer 30.

The substrate 10 may or may not be transparent. The thickness of the substrate is not particularly limited as long as the substrate has an appropriate strength allowed in the organic electrochemical device. The substrate may be glass, plastic, metal, ceramic, and the like. Examples of the glass comprise soda glass, borosilicate glass, aluminosilicate glass, aluminoborosilicate glass, silica glass, soda lime glass, and the like. Examples of the plastic substrate comprise polyester sheet such as polyethylene terephthalate and polyethylene naphthalate, and sheet such as polyphenylene sulfide, polycarbonate, polysulfone, and polyethylidene norbornene. Examples of the ceramic comprise high-purity alumina, and the like.

The material for the first electrode 20 is not particularly limited, and metal, conductive oxide, carbon material, conductive polymer and the like may be applied. Examples of the metal comprise titanium, nickel, platinum, gold, silver, copper, aluminum, tungsten, rhodium, indium, and the like. Examples of the conductive oxide comprise tin oxide, fluorine-doped tin oxide (FTO), indium oxide, tin-doped indium oxide (ITO), zinc oxide, and the like. Examples of the carbon material comprise carbon nanotubes, graphene, carbon black, and the like. Examples of the conductive polymer comprise PEDOT-PSS, polypyrrole, polyaniline, poly-3,4-ethylenedioxythiophene (poly-EDT), and the like. These materials may be used either alone or in combination thereof.

The first electrode 20 may be coated on the substrate by a deposition method. The first electrode may be formed by depositing a conductive material such as metal, conductive oxide, carbon material, and conductive polymer on the substrate 10 by physical vapor deposition such as thermal metal evaporation, electron beam evaporation, RF sputtering, magnetron sputtering, atomic layer deposition, arc vapor deposition, and ion beam assisted deposition, or a chemical vapor deposition process such as chemical vapor deposition (CVD), metal organic chemical vapor deposition (MOCVD), and plasma-enhanced chemical vapor deposition (PECVD).

Figure 3:
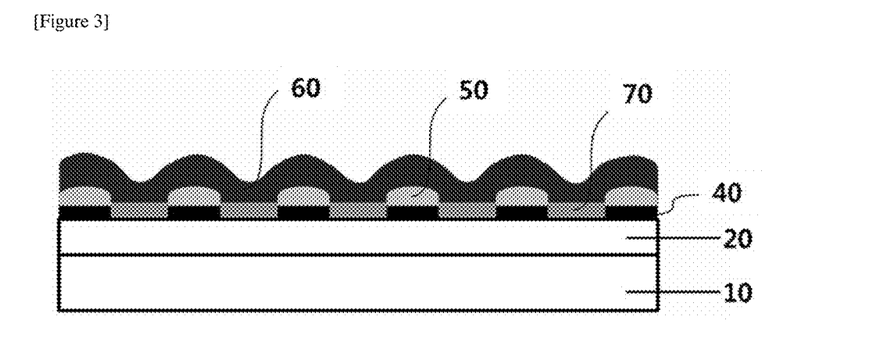
FIG. 3 is a view schematically illustrating an organic electrochemical device according to a third exemplary embodiment of the present invention.

The intermediate layer 30 may be formed on the first electrode 20. The intermediate layer may comprise a hole transporting layer, and an insulating layer. An organic electrochemical device comprising a hole transporting layer 70 and an insulating layer 40 as the intermediate layer is schematically illustrated in the following FIG. 3.

Figure 2:
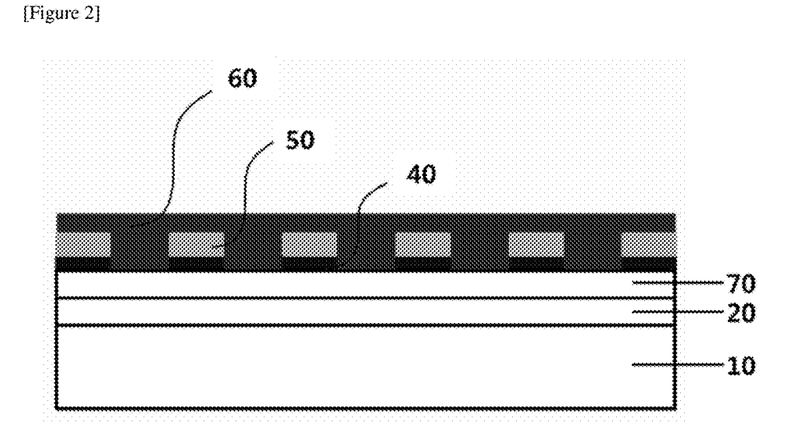
FIG. 2 is a view schematically illustrating an organic electrochemical device according to a second exemplary embodiment of the present invention.

Furthermore, the intermediate layer comprises the hole transporting layer 70, and may additionally comprise the insulating layer 40 between the intermediate layer and the second electrode. An organic electrochemical device having the structure is schematically illustrated in the following FIG. 2.

The hole transporting layer 70 may comprise a hole transporting material. The hole transporting material a material which may transport holes between the first electrode 20 and the first organic material layer 60, and is suitably a material having high hole mobility. Specific examples thereof comprise arylamine-based organic materials, conductive polymers, block copolymers having both conjugated portions and non-conjugated portions and the like, but are not limited thereto.

More specifically, examples of the hole transporting material comprise poly(3,4-ethylenediocythiophene) doped with poly(styrenesulfonic acid) (PEDOT:PSS), N,N'-bis(3-methylphenyl)-N,N'-diphenyl-[1,1'-biphenyl]-4,4'-diamine (TPD), and the like, but are not limited thereto.

The insulating layer 40 may be formed by using a material and a method known in the art.

The intermediate layer 30 may have lower conductivity than those of the first electrode 20 and the second electrode 50.

The second electrode 50 may be formed on the intermediate layer 30. The second electrode 50 may comprise regular patterns or irregular patterns.

The material for the second electrode 50 is not particularly limited, and metal, conductive oxide, carbon material, conductive polymer, and the like may be applied. Examples of the metal comprise titanium, nickel, platinum, gold, silver, copper, aluminum, tungsten, rhodium, indium, and the like. Examples of the conductive oxide comprise tin oxide, fluorine-doped tin oxide (FTO), indium oxide, tin-doped indium oxide (ITO), zinc oxide, and the like. Examples of the carbon material comprise carbon nanotubes, graphene, carbon black, and the like. Examples of the conductive polymer comprise PEDOT-PSS, polypyrrole, polyaniline, poly-EDT, and the like. These materials may be used either alone or in combination thereof.

The second electrode 50 may be coated on the substrate by a deposition method. The second electrode may be formed by depositing a conductive material such as metal, conductive oxide, carbon material, and conductive polymer on the substrate 30 by physical vapor deposition such as thermal metal evaporation, electron beam evaporation, RF sputtering, magnetron sputtering, atomic layer deposition, arc vapor deposition, and ion beam assisted deposition, or a chemical vapor deposition process such as CVD, MOCVD, and PECVD.

In particular, in the structure of the organic solar cell in the related art as illustrated in the following FIG. 15, light is absorbed from the side of the glass surface, but in the present invention, light may be absorbed by or emitted into the side of the first organic material layer surface formed on the second electrode by forming the second electrode 50 in regular patterns or irregular patterns.

Further, in the present invention, both the first electrode 20 and the second electrode 50 may be a metal electrode. Accordingly, it is possible to provide an organic electrochemical device having excellent conductivity.

The first organic material layer 60 may be formed on the second electrode 50 and the intermediate layer 30. Accordingly, at least a part of the first organic material layer 60 may be in contact with the second electrode and the intermediate layer.

Figure 4:
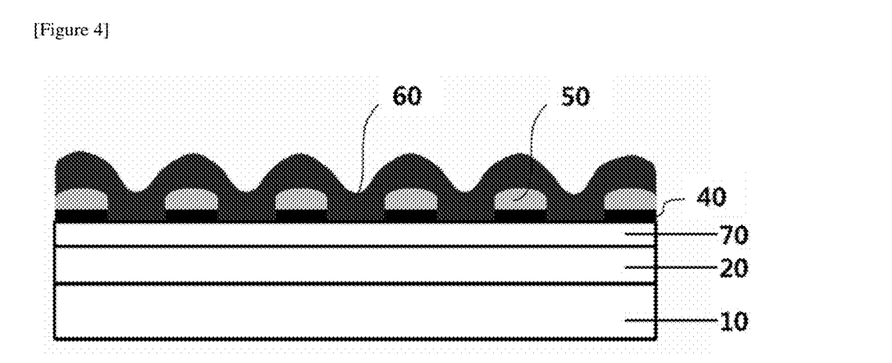
FIG. 4 is a view schematically illustrating an organic electrochemical device according to a fourth exemplary embodiment of the present invention.

The surface state of the first organic material layer 60 is not particularly limited. The surface state of the first organic material layer 60 may be in the form of a flat surface as illustrated in the following FIG. 2, and may be in the form of a curved surface as illustrated in the following FIG. 4.

Figure 5:
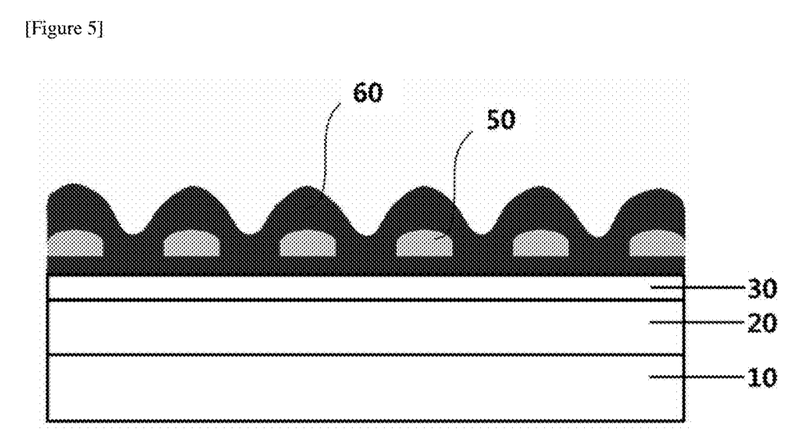
FIG. 5 is a view schematically illustrating an organic electrochemical device according to a fifth exemplary embodiment of the present invention.

In addition, the organic electrochemical device according to the present invention may have a structure in which the second electrode 50 is comprised in the first organic material layer 60 as illustrated in the following FIG. 5.

The first organic material layer 60 may be an organic photoactive layer.

When the organic electrochemical device is applied to an organic solar cell, the organic photoactive layer may comprise an electron donor material and/or an electron acceptor material.

As the electron donor material, it is possible to use a polymer compound which is suitable for the light absorption wavelength range or solar light spectrum, has a strong light absorption, and has excellent electrical properties such as mobility of electric charges. The electron donor material may comprise poly(3-hexylthiophene) (P3HT), which is a complex polymer material, but is not limited thereto.

The electron acceptor material may be fullerene, fullerene derivatives, vasocuproin, semiconductor elements, semiconductor compounds, or combinations thereof, and specifically, may be phenyl C61-butyric acid methyl ester (PC61BM), or phenyl C71-butyric acid methyl ester (PC71BM), but is not limited thereto.

In the organic photoactive layer, the electron donor material and the electron acceptor material may form a bulk heterojunction (BHJ). The electron donor material and the electron acceptor material may be mixed with each other at a ratio of 1:10 to 10:1 (w/w: mass ratio). The electron donor material and the electron acceptor material are mixed, and then may be annealed at 30° C. to 300° C. for 1 second to 24 hours in order to maximize the characteristics thereof.

The thickness of the organic photoactive layer may be 10 Å to 10,000 Å, but is not limited thereto.

When the organic electrochemical device is applied to an organic light emitting element, the organic photoactive layer may comprise a light emitting material. The light emitting material is a material that is capable of emitting light in a visible light region by accepting and recombining holes from the hole transporting layer and electrons from the electron transporting layer, and preferably a material having high quantum efficiency for fluorescence and phosphorescence. Specific examples thereof comprise: 8-hydroxy-quinoline-aluminum complex ($Alq_3$); carbazole-based compounds; dimerized styryl compounds; BAlq; 10-hydroxybenzoquinoline-metal compounds; benzoxazole-based, benzthiazole-based, and benzimidazole-based compounds; poly(p-phenylenevinylene)(PPV)-based polymers; spiro compounds; and polyfluorene, rubrene, and the like, but are not limited thereto.

When the organic electrochemical device is applied to an organic electrochromic element, the organic photoactive layer may be an organic electrochromic layer.

As described above, the organic electrochemical device according to the present invention may be applied to various organic electrochemical devices, such as organic solar cells, organic photodetection elements, organic light emitting elements, and organic electrochromic elements, by controlling a material comprised in the first organic material layer so as to be suitable for the use thereof.

Figure 6:
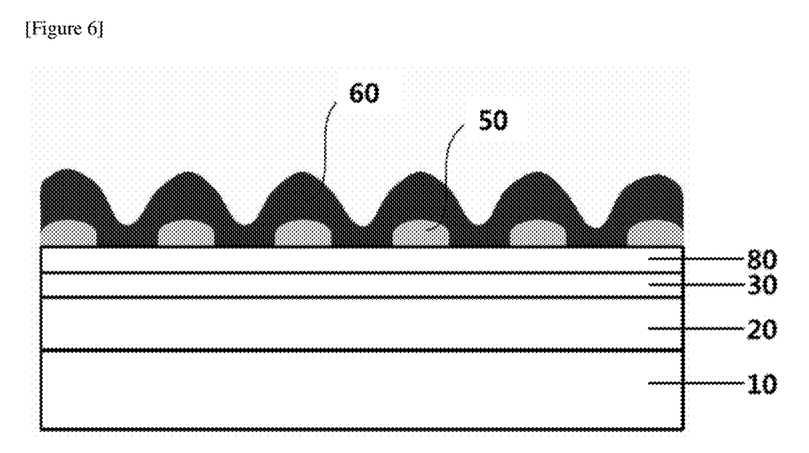
FIG. 6 is a view schematically illustrating an organic electrochemical device according to a sixth exemplary embodiment of the present invention.

The organic electrochemical device according to the present invention may additionally comprise a second organic material layer 80 between the intermediate layer 30 and the first organic material layer 60. A schematic structure of an organic electrochemical device having the structure is illustrated in the following FIG. 6.

The second organic material layer may comprise the aforementioned materials exemplified as the material for the first organic material layer. It is preferred that the first organic material layer comprises a first material, the second organic material layer comprises a second material, and the first material and the second material comprise different materials from each other. Furthermore, it is preferred that the first material and the second material may absorb light in different wavelength ranges from each other and the second material absorbs light having a longer wavelength than the first material, but the present invention is not limited thereto.

Figure 7:
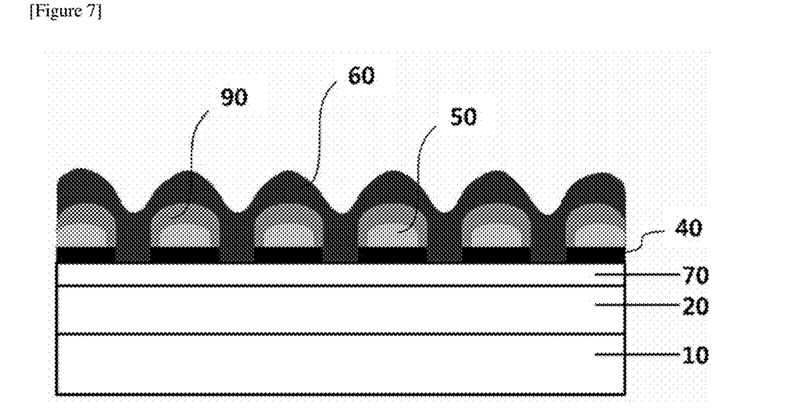
FIG. 7 is a view schematically illustrating an organic electrochemical device according to a seventh exemplary embodiment of the present invention.

The organic electrochemical device according to the present invention may additionally comprise an electron transporting layer 90 between the first organic material layer 60 and the second electrode 50. A schematic structure of an organic electrochemical device having the structure is illustrated in the following FIG. 7.

The electron transporting layer 90 may comprise an electron transporting material. The electron transporting material is a material which may accept and transfer electrons from the second electrode to the first organic material layer 60, and is suitably a material having high electron mobility. Specific examples thereof comprise aluminum trihydroxyquinoline (Alq3), 2-(4-bipheyl)-5-phenyl-1,3,4-oxadiazole (PBD) which is a 1,3,4-oxadiazole derivative, 1,3,4-tris[(3-phenyl-6-trifluoromethyl)qunoxaline-2-yl]benzene (TPQ) which is a quinoxaline derivative, a triazole derivative, and the like, but are not limited thereto.

It is possible to fabricate the intermediate layer 30, the insulating layer 40, the hole transporting layer 70, the first organic material layer 60, the second organic material layer 70, the electron transporting layer 90, and the like using various polymer materials by the above-described deposition process, or a solvent process, for example, a method such as spin coating, dip coating, doctor blading, screen printing, inkjet printing, or a thermal transfer method.

Figure 8:
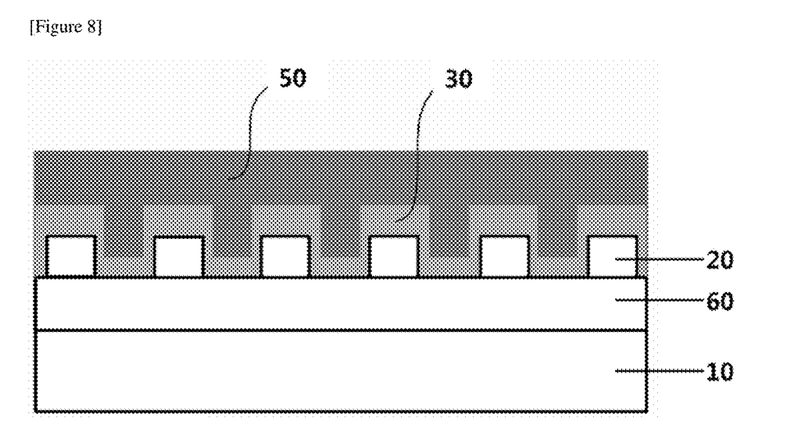
FIG. 8 is a view schematically illustrating an organic electrochemical device according to an eighth exemplary embodiment of the present invention.

FIG. 8 is a view schematically illustrating an organic electrochemical device according to an eighth exemplary embodiment of the present invention. The organic electrochemical device according to the eighth exemplary embodiment comprises a substrate 10, a first organic material layer 60 provided on the substrate, a first electrode 20 provided on the first organic material layer 60, a second electrode 50, and an intermediate layer 30 provided between the first organic material layer 60 and the second electrode 50, in which at least a part of the intermediate layer 30 is in contact with the first electrode 20 and the first organic material layer 60.

It is preferred that the substrate 10 of the organic electrochemical device according to the eighth exemplary embodiment is transparent.

The first electrode 20 of the organic electrochemical device according to the eighth exemplary embodiment may comprise regular patterns or irregular patterns. In the present invention, light may be absorbed by or emitted into the side of the substrate surface at a lower surface of the first electrode by forming the first electrode 20 in regular patterns or irregular patterns.

Further, in the present invention, both the first electrode 20 and the second electrode 50 may be a metal electrode. Accordingly, it is possible to provide an organic electrochemical device having excellent conductivity.

Figure 9:
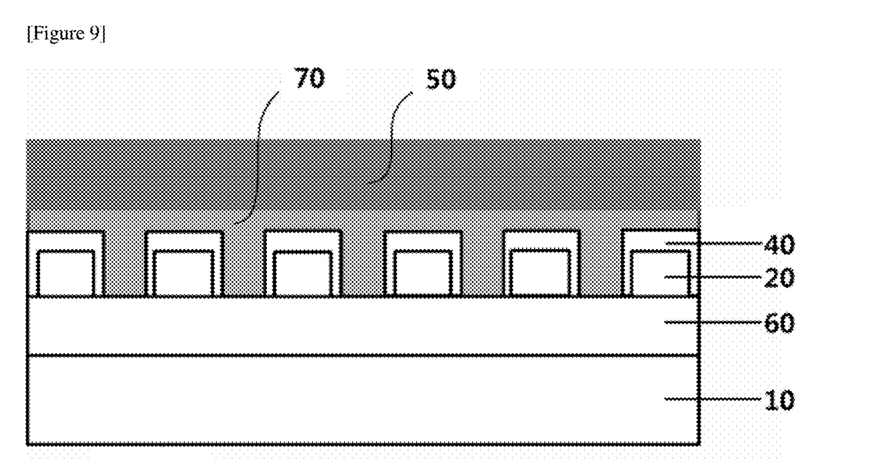
FIG. 9 is a view schematically illustrating an organic electrochemical device according to a ninth exemplary embodiment of the present invention.

In the organic electrochemical device according to the eighth exemplary embodiment, the intermediate layer 30 may comprise a hole transporting layer 70, and an insulating layer 40. In addition, the intermediate layer 30 comprises the hole transporting layer 70, and may additionally comprise the insulating layer 40 between the intermediate layer 30 and the first electrode 20. An organic electrochemical device having the structure is schematically illustrated in the following FIG. 9.

Figure 10:
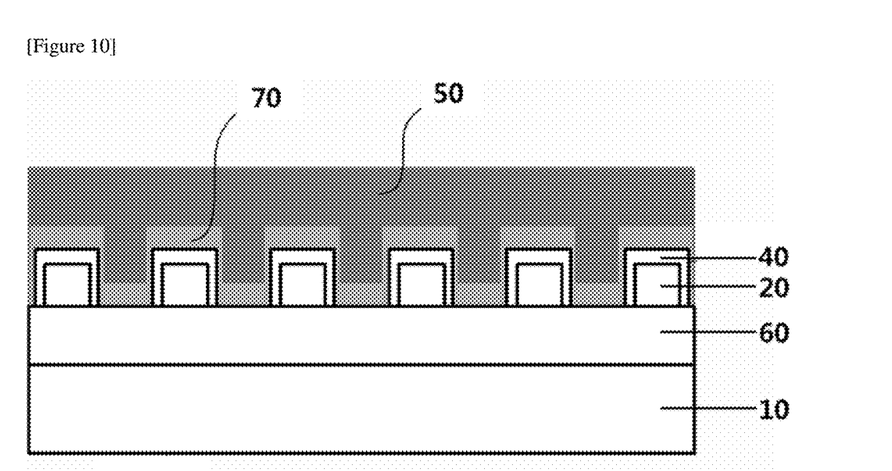
FIG. 10 is a view schematically illustrating an organic electrochemical device according to a tenth exemplary embodiment of the present invention.

The surface state of the hole transporting layer 70 is not particularly limited. The surface state of the hole transporting layer 70 may be a flat surface form as illustrated in the following FIG. 9, and may be an unevenness form as illustrated in the following FIG. 10.

Figure 11:
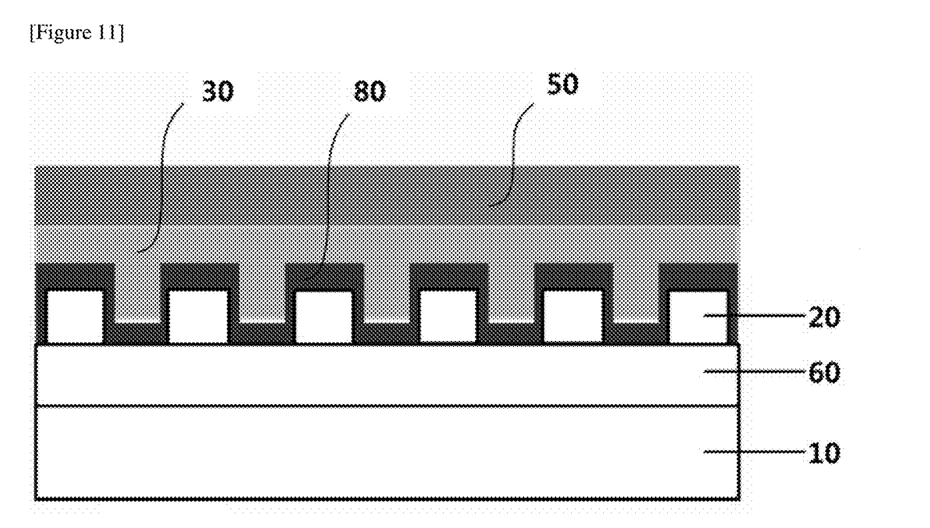
FIG. 11 is a view schematically illustrating an organic electrochemical device according to an eleventh exemplary embodiment of the present invention.

The organic electrochemical device according to the eighth exemplary embodiment may additionally comprise a second organic material layer 80 between the intermediate layer 30 and the first organic material layer 60. A schematic structure of an organic electrochemical device having the structure is illustrated in the following FIG. 11.

In the organic electrochemical device according to the eighth exemplary embodiment, the material and forming method for the first electrode 20, the intermediate layer 30, the insulating layer 40, the second electrode 50, the hole transporting layer 70, the first organic material layer 60, the second organic material layer 70, the electron transporting layer 90, and the like are the same as or similar to those described above, and thus the specific description thereof will be omitted.

The organic electrochemical device according to the present invention may be applied to various organic electrochemical devices such as organic solar cells, organic photodetection elements, organic light emitting elements, and organic electrochromic elements.

Figure 12:
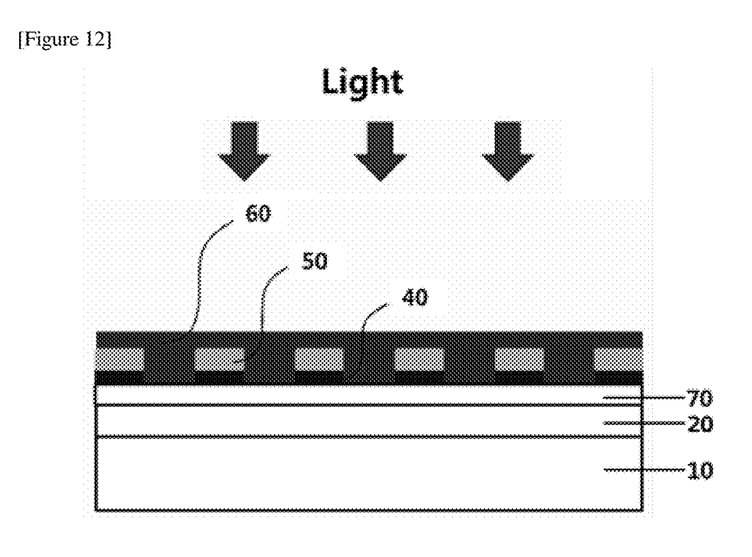
FIG. 12 is a view schematically illustrating an organic solar cell according to a twelfth exemplary embodiment of the present invention.
Figure 13:
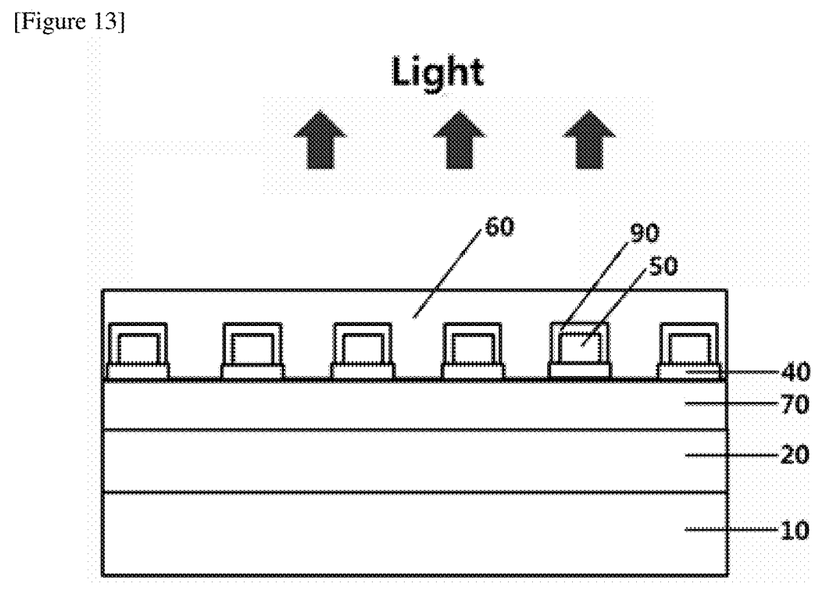
FIG. 13 is a view schematically illustrating an organic light emitting element according to a thirteenth exemplary embodiment of the present invention.
Figure 14:
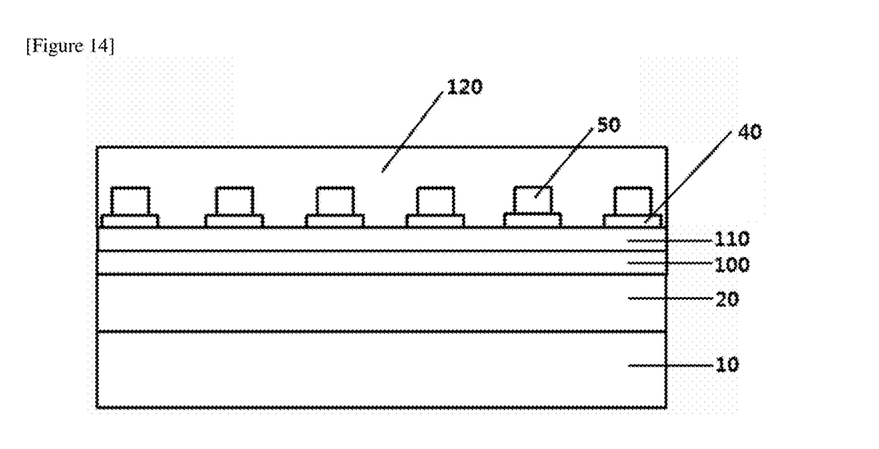
FIG. 14 is a view schematically illustrating an organic electrochromic element according to a fourteenth exemplary embodiment of the present invention.

An organic solar cell in the related art is schematically illustrated in the following FIG. 15. In addition, the organic solar cell according to the present invention is schematically illustrated in the following FIG. 12, the organic light emitting element according to the present invention is schematically illustrated in the following FIG. 13, and the organic electrochromic element according to the present invention is illustrated in the following FIG. 14.

Furthermore, a method for fabricating an organic electrochemical device according to an exemplary embodiment of the present invention comprises: forming a first electrode on a substrate; forming an intermediate layer on the first electrode; forming a second electrode on the intermediate layer such that at least a part of the second electrode is in contact with the intermediate layer; and forming a first organic material layer on the intermediate layer.

Further, a method for fabricating an organic electrochemical device according to another exemplary embodiment of the present invention comprises: forming a first organic material layer on a substrate; forming a first electrode on the first organic material layer such that at least a part of the first electrode is in contact with the first organic material layer; forming an intermediate layer on the first organic material layer and the first electrode; and forming a second electrode on the intermediate layer.

In the method for fabricating an organic electrochemical device according to the present invention, the material and forming method for the first electrode 20, the intermediate layer 30, the insulating layer 40, the second electrode 50, the hole transporting layer 70, the first organic material layer 60, the second organic material layer 70, the electron transporting layer 90, and the like are the same as or similar to those described above, and thus the specific description thereof will be omitted.

The organic electrochemical device according to an exemplary embodiment of the present invention may improve power conversion efficiency because an organic active layer may be formed on a second electrode and an intermediate layer. In addition, the organic electrochemical device according to another exemplary embodiment of the present invention may use metal electrodes as a first electrode and a second electrode, thereby improving conductivity and being implemented at low costs.

Furthermore, the organic electrochemical device according to yet another exemplary embodiment of the present invention may improve flexibility of the organic electrochemical device by comprising an organic material layer on a second electrode, may reduce loss of light according to the light absorption of an electrode, a hole transporting layer, and the like by directly irradiating light on the organic material layer provided at an upper portion of the second electrode without passing light through a transparent electrode, and may increase the re-absorption rate of light due to reflection of light from a metal electrode. The organic electrochemical device according to the present invention may be applied to various organic electrochemical devices such as organic solar cells, organic photodetection elements, organic light emitting elements, and organic electrochromic elements.

The invention claimed is:

1. An organic solar cell device comprising:
   a substrate;
   a first electrode on the substrate;
   an intermediate layer on the first electrode;
   a second electrode on the intermediate layer; and
   a first organic material layer on top of the intermediate layer and the second electrode,
   wherein at least a part of the first organic material layer is in direct contact with the intermediate layer,
   wherein the second electrode comprises regular patterns or irregular patterns,
   wherein both the first electrode and the second electrode are metal electrodes, and
   wherein the intermediate layer comprises a hole transporting layer.

2. The organic solar cell device of claim 1, wherein the intermediate layer comprises an insulating layer.

3. The organic solar cell device of claim 1, further comprising:
   an insulating layer provided between the intermediate layer and the second electrode.

4. The organic solar cell device of claim 1, wherein the first organic material layer is an organic photoactive layer.

5. The organic solar cell device of claim 1, further comprising:
   a second organic material layer provided between the intermediate layer and the first organic material layer.

6. The organic solar cell device of claim 5, wherein the first organic material layer comprises a first material, the second organic material layer comprises a second material, and the first material and the second material are different materials from each other.

7. The organic solar cell device of claim 6, wherein the first material and the second material absorb light in different wavelength ranges from each other.

8. The organic solar cell device of claim 7, wherein the second material absorbs light having a longer wavelength than the first material.

9. The organic solar cell device of claim 1, further comprising:
   an electron transporting layer provided on the second electrode.

10. A method for fabricating an organic solar cell device, the method comprising:
    forming a first electrode on a substrate;
    forming an intermediate layer on the first electrode;
    forming a second electrode on the intermediate layer such that at least a part of the second electrode is in direct contact with the intermediate layer; and
    forming a first organic material layer on top of the intermediate layer and the second electrode,
    wherein at least a part of the first organic material layer is in direct contact with the intermediate layer,
    wherein the second electrode comprises regular patterns or irregular patterns,
    wherein both the first electrode and the second electrode are metal electrodes, and
    wherein the intermediate layer comprises a hole transporting layer.

11. The organic solar cell device of claim 1, wherein the second electrode is between the first electrode and the first organic material layer.

12. The organic solar cell device of claim 11, wherein the second electrode and the first organic material layer are spaced apart from the substrate.

13. The organic solar cell device of claim 1, wherein the first electrode comprises a single first electrode, and
    wherein the second electrode comprises a plurality of second electrodes, and at least three electrodes of the plurality of second electrodes overlap the first electrode.

14. The organic solar cell device of claim 1, wherein the second electrode comprises a plurality of second electrodes that are spaced apart from each other,
    wherein two adjacent electrodes of the plurality of second electrodes define one of a plurality of recesses, and
    wherein the first organic material layer comprises a plurality of portions extending into the plurality of recesses, respectively.

* * * * *